United States Patent
Roh et al.

(10) Patent No.: US 10,490,592 B2
(45) Date of Patent: Nov. 26, 2019

(54) STACKED IMAGE SENSOR

(71) Applicant: SAMSUNG ELECTRONICS CO., LTD., Suwon-si (KR)

(72) Inventors: Sookyoung Roh, Seoul (KR); Seokho Yun, Hwaseong-si (KR); Sunghyun Nam, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 106 days.

(21) Appl. No.: 15/280,252

(22) Filed: Sep. 29, 2016

(65) Prior Publication Data

US 2017/0098680 A1    Apr. 6, 2017

(30) Foreign Application Priority Data

Oct. 2, 2015 (KR) .......................... 10-2015-0139109

(51) Int. Cl.
*H01L 27/146* (2006.01)

(52) U.S. Cl.
CPC .... *H01L 27/14647* (2013.01); *H01L 27/1461* (2013.01); *H01L 27/1463* (2013.01); *H01L 27/14605* (2013.01); *H01L 27/14621* (2013.01); *H01L 27/14623* (2013.01)

(58) Field of Classification Search
CPC ......... H01L 27/14647; H01L 27/14607; H01L 27/14605
USPC ....................................................... 257/432
See application file for complete search history.

(56) References Cited

U.S. PATENT DOCUMENTS

| | | | |
|---|---|---|---|
| 8,698,265 B2* | 4/2014 | Yoon | H01L 27/14618 257/435 |
| 2002/0058353 A1 | 5/2002 | Merrill | |
| 2010/0177408 A1* | 7/2010 | Lake | G02B 3/0031 359/819 |
| 2010/0254596 A1* | 10/2010 | Xiong | G06T 3/4053 382/159 |
| 2011/0018042 A1* | 1/2011 | Lee | H01L 27/14603 257/292 |
| 2012/0044342 A1* | 2/2012 | Hing | G02B 21/361 348/79 |
| 2012/0273855 A1* | 11/2012 | Lee | H01L 27/14603 257/292 |
| 2012/0293706 A1* | 11/2012 | Usui | H04N 5/23212 348/345 |

(Continued)

FOREIGN PATENT DOCUMENTS

| | | |
|---|---|---|
| JP | 2006-210560 A | 8/2006 |
| JP | 2008-288404 A | 11/2008 |

(Continued)

*Primary Examiner* — Bo Fan
(74) *Attorney, Agent, or Firm* — Sughrue Mion, PLLC

(57) ABSTRACT

A stacked image sensor includes a first photoelectric conversion layer including a plurality of first photoelectric conversion regions; a second photoelectric conversion layer disposed on the first photoelectric conversion layer, and including a plurality of second photoelectric conversion regions; and a plurality of color filters disposed on the plurality of second photoelectric conversion regions, wherein at least one of the plurality of first photoelectric conversion regions includes a plurality of third photoelectric conversion regions that perform auto-focusing.

11 Claims, 4 Drawing Sheets

(56) References Cited

U.S. PATENT DOCUMENTS

2013/0182173 A1* 7/2013 Murata ............ H01L 27/14605
              348/349
2014/0320735 A1   10/2014 Ikedo
2015/0364521 A1   12/2015 Nam

FOREIGN PATENT DOCUMENTS

KR    10-2011-0036995 A    4/2011
KR    10-2011-0052256 A    5/2011
KR    10-2015-0143147 A    12/2015

* cited by examiner

STACKED IMAGE SENSOR

CROSS-REFERENCE TO RELATED APPLICATION

This application claims priority from Korean Patent Application No. 10-2015-0139109, filed on Oct. 2, 2015 in the Korean Intellectual Property Office, the disclosure of which is incorporated herein by reference in its entirety.

BACKGROUND

1. Field

Apparatuses consistent with exemplary embodiments relate to stacked image sensors including a photoelectric conversion region for measuring an image and a photoelectric conversion region for auto focusing, which are vertically stacked.

2. Description of the Related Art

An auto-focusing (AF) method used by a camera includes phase detection AF and contrast detection AF. In the phase detection AF, images are measured by dividing light that enters through a focusing lens into more than two AF sensors. At this point, a focusing distance is determined at a location of the focusing lens when locations of the images measured by the AF sensors are almost equal.

In the contrast detection AF, a location of a focusing lens where a contrast difference between adjacent images is the largest is determined as a focusing distance. The contrast detection AF is advantageous over the phase detection AF in that a focus is correctly determined, but the determining speed is slower than in the phase detection AF.

A method of determining a focusing distance that is recently generally used is a hybrid AF method. In the hybrid AF method, some regions of image sensors are replaced by AF sensors, and the phase detection AF is used to the vicinity of a focus when an AF function is executed, and afterwards, the contrast detection AF is used to finely adjust the correct focus.

However, since some of the image sensors have been replaced by AF sensors, image information may be reduced in proportion to the number of replaced AF sensors, and thus, the resolution of a camera may be reduced.

SUMMARY

One or more exemplary embodiments provide stacked image sensors including auto-focusing (AF) sensors stacked on image sensors.

According to an aspect of an exemplary embodiment, there is provided a stacked image sensor configured to perform auto-focusing including: a first photoelectric conversion layer including a plurality of first photoelectric conversion regions; a second photoelectric conversion layer disposed on the first photoelectric conversion layer, and including a plurality of second photoelectric conversion regions; and a plurality of color filters disposed on the plurality of second photoelectric conversion regions, wherein at least one of the plurality of first photoelectric conversion regions includes a plurality of third photoelectric conversion regions that perform auto-focusing.

The stacked image sensor further includes a plurality of pixel regions disposed on the plurality of color filters to correspond to the plurality of first photoelectric conversion regions, and each of the plurality of first photoelectric conversion regions includes the plural third photoelectric conversion regions.

Each of the plurality of first photoelectric conversion regions may include two third photoelectric conversion regions.

At least one of the plurality of second photoelectric conversion regions respectively may include a plurality of fourth photoelectric conversion regions.

The plurality of fourth photoelectric conversion regions may include two fourth photoelectric conversion regions.

The stacked image sensor may further include first barriers that separate the plurality of pixel regions from one another and vertically pass through the second photoelectric conversion layer and the first photoelectric conversion layer.

Each first barrier may include a trench that divides the pixels, an insulating layer that covers an inner sidewall of the trench to make a hole therein, and a light absorption layer filled in the hole that is surrounded by an outer sidewall of the trench.

The stacked image sensor may further include a second barrier that separates the plurality of third photoelectric conversion regions in the corresponding pixel region and vertically passes through the first photoelectric conversion layer.

According to an aspect of the exemplary embodiment, the plurality of color filters may include a plurality of color filter units arranged in an array, and each of the plurality of color filter units includes a red color filter, two green color filters, and a blue color filter.

According to another aspect of the exemplary embodiment, the plurality of color filters may include a plurality of color filter units arranged in an array, and each of the plurality of color filter units includes a red color filter, two white color filters, and a blue color filter.

The first photoelectric conversion layer and the second photoelectric conversion layer may be a silicon layer doped with a first impurity, and the first photoelectric conversion regions and the second photoelectric conversion region may be doped with a second type impurity.

The stacked image sensor may further include a plurality of micro-lenses disposed on the color filters to face the first photoelectric conversion layer.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
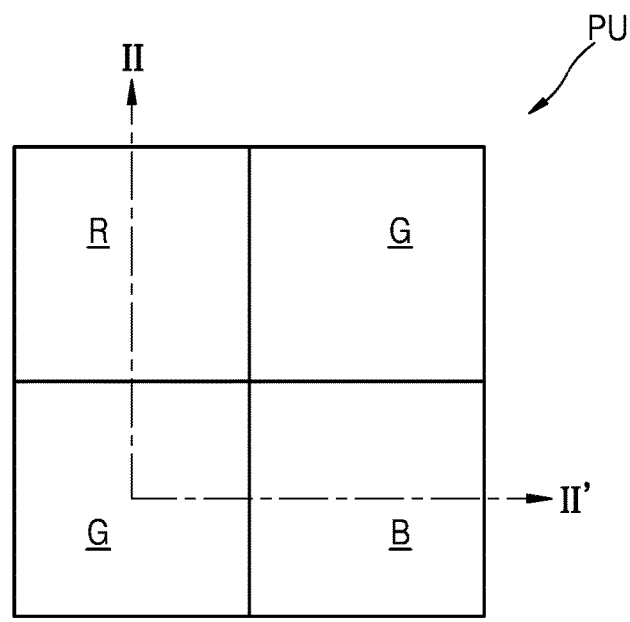
FIG. 1 is a plan view of a unit pixel of a stacked image sensor according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

It will be understood that when an element or layer is referred to as being "on" another element or layer, the element or layer may be directly on another element or layer or intervening elements or layers.

Figure 2:
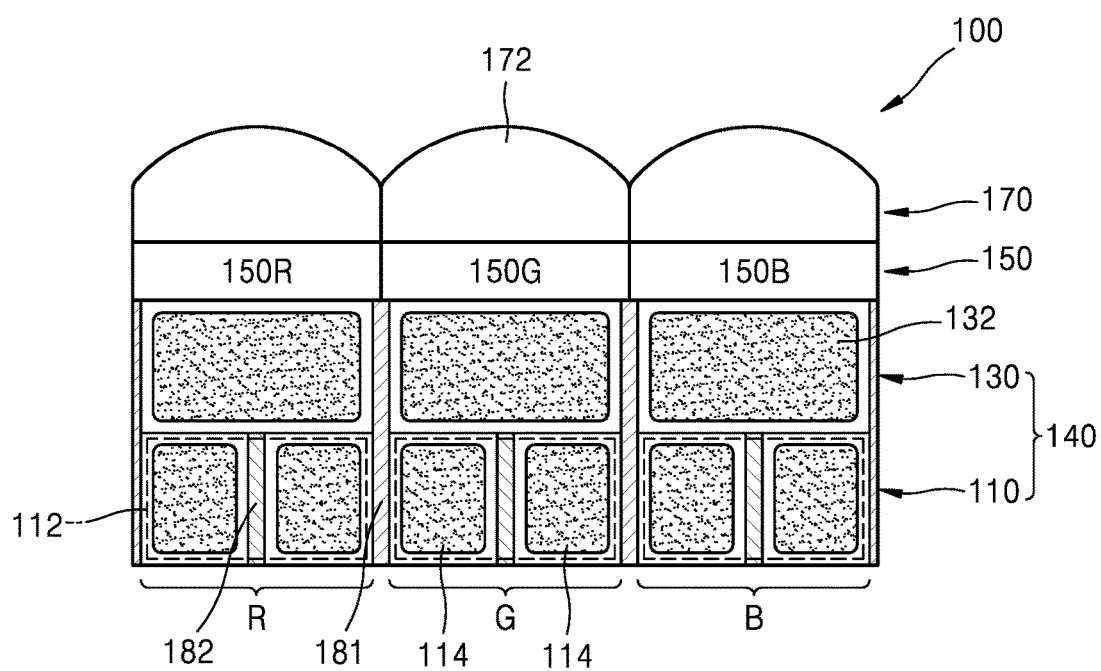
FIG. 2 is a cross-sectional view taken along a line II-II' of FIG. 1.

FIG. 1 is a plan view of a unit pixel of a stacked image sensor 100 according to an exemplary embodiment. FIG. 2 is a cross-sectional view taken along a line II-II' of FIG. 1.

Referring to FIG. 1, a pixel unit PU may include two green pixels G, a red pixel R, and a blue pixel B. FIG. 1 shows a Bayer pattern as an example, but the exemplary embodiment is not limited thereto. For example, the locations of the color pixels R, G, and B may be different from those shown in FIG. 1. Also, the pixel unit PU may include cyan, yellow, green, and magenta pixels. The stacked image sensor 100 may include a plurality of pixel units PU arranged in an array.

Referring to FIG. 2, the pixel unit PU may include a first photoelectric conversion layer 110. A second photoelectric conversion layer 130, a color filter layer 150, and a micro-lens layer 170 are sequentially stacked on the first photoelectric conversion layer 110.

The first photoelectric conversion layer 110 and the second photoelectric conversion layer 130 may be disposed in a silicon layer 140. The first photoelectric conversion layer 110 may include first photoelectric conversion regions 112 respectively disposed in the corresponding pixels. Each first photoelectric conversion region 112 may include a plurality of third photoelectric conversion regions 114. Each first photoelectric conversion region 112 may include two to four third photoelectric conversion regions 114. The first photoelectric conversion region 112 may include two third photoelectric conversion regions 114.

The second photoelectric conversion layer 130 may include one second photoelectric conversion region 132 at the corresponding pixel. The two third photoelectric conversion regions 114 and the second photoelectric conversion region 132 in one pixel may be doped regions. For example, the silicon layer 140 may be doped with a first type impurity, and the third photoelectric conversion regions 114 and the second photoelectric conversion region 132 may be regions doped with a second impurity. When the first impurity is an n-type impurity, the second type impurity may be a p-type impurity, and vice versa.

The second photoelectric conversion region 132 may be a general image detection region. The third photoelectric conversion regions 114 may perform auto-focusing by detecting light passing through the second photoelectric conversion region 132 thereon. That is, the two third photoelectric conversion regions 114 in the pixel may perform phase detection auto-focusing (AF).

The third photoelectric conversion regions 114 may be also used as image detection regions.

The color filter layer 150 may include a plurality of color filters 150R, 150G, and 150B. In the red pixel R, the red color filter 150R is disposed on the second photoelectric conversion region 132 to selectively transmit red light. In the green pixel G, the green color filter 150G is disposed on the second photoelectric conversion region 132 to selectively transmit green light. In the blue pixel B, a blue color filter 150B is disposed on the second photoelectric conversion region 132 to selectively transmit blue light.

The micro-lens layer 170 may include a plurality of micro-lenses 172. The micro-lenses 172 are disposed on each of the color filters 150R, 150G, and 150B to collect incident light and to transmit collected light to the corresponding color filters 150R, 150G, and 150B.

The stacked image sensor 100 may include first barriers 181 that divide the pixels R, G, and B. The first barriers 181 may vertically pass through the first photoelectric conversion layer 110 and the second photoelectric conversion layer 130. The two third photoelectric conversion regions 114 and the second photoelectric conversion region 132 corresponding to the pixel may be disposed in a pixel region surrounded by the first barriers 181.

Figure 3:
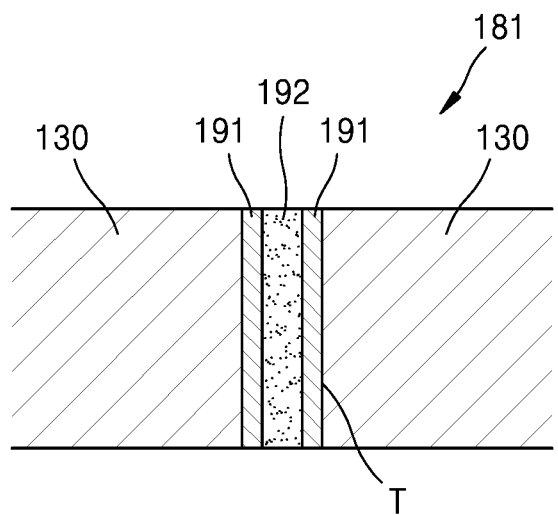
FIG. 3 is a cross-sectional view of a structure of a first barrier of FIG. 2 according to an exemplary embodiment.

FIG. 3 is a cross-sectional view showing a structure of the first barrier 181 of FIG. 2. Referring to FIG. 3, each first barrier 181 may include a trench T that separates the pixels R, G, and B, an insulating layer 191 that covers an inner wall of the trench T, and a light absorption layer 192 that fills a hole formed by the insulating layer 191. The insulating layer 191 may be formed of thin silicon oxide. The light absorption layer 192 may be formed of, for example, polysilicon.

A second barrier 182 that separates the two third photoelectric conversion regions 114 in each of the pixels R, G, and B may be disposed in the first photoelectric conversion layer 110. The second barrier 182 may have the same structure as the first barriers 181 of FIG. 3, and the detailed description thereof will not be repeated.

The first barriers 181 and the second barrier 182 prevent incident light on a pixel from entering other adjacent pixel regions that causes a noise. That is, the insulating layer 191 reflects light that enters adjacent pixels after entering into a pixel, and light transmitted through the insulating layer 191 may be absorbed by the light absorption layer 192.

The stacked image sensor 100 may further include a signal processor that processes an electrical signal by receiving charges from the photoelectric conversion regions. The signal processor may include three to four transistors. The signal processor may be disposed below the first photoelectric conversion layer 110.

When visible light enters the stacked image sensor 100 from an image measuring object, red light of visible light passes through the red color filter 150R and generates charges in the second photoelectric conversion region 132. Based on the generated charges, the signal processor outputs an intensity signal of the red light. Green light and blue light of visible light enter the corresponding second photoelectric conversion region 132 respectively through the green color filter 150G and the blue color filter 150B and generate charges. Based on generated charges, the signal processor outputs intensity signals of the green light and the blue light.

Lights that passed through the second photoelectric conversion regions 132 of the respective pixel is detected by the two third photoelectric conversion regions 114. Phase detection auto-focusing may be performed using images of the two third photoelectric conversion regions 114. A focusing lens is fixed on an auto-focused location, and then, images are picked up.

After performing the phase detection auto-focusing, the location of the focusing lens may be determined by performing contrast detection auto-focusing with respect to a contrast difference of images from the second photoelectric conversion region 132.

When an image is picked up under high illumination conditions, an amount of light entering the focusing lens is increased. Accordingly, image pickup may be difficult since the light entered the second photoelectric conversion region 332 is saturated. In this case, a relatively small amount of light enters the third photoelectric conversion regions 114 used for auto-focusing, and thus, the first photoelectric conversion regions 112 may be used for image pickup. That is, the first photoelectric conversion regions 112 may perform both auto-focusing and image pickup.

The stacked image sensor 100 according to the exemplary embodiment includes a photoelectric conversion region for auto-focusing on a lower side of an image measuring pixel, and thus, a high resolution image may be obtained since all pixel regions are used for image photographing while performing auto-focusing.

Also, under high illumination conditions, image pickup may be performed by using the first photoelectric conversion layer 110 into which a relatively small amount of light entered, and thus, a high resolution image may be obtained even under high illumination conditions.

In the exemplary embodiment, the first photoelectric conversion regions 112 are disposed below the second photoelectric conversion region 132, but the exemplary embodiment is not limited thereto. For example, the first photoelectric conversion regions 112 for auto-focusing may be disposed between the second photoelectric conversion region 132 for image pickup and the color filter layer 150, and the description thereof will be omitted.

Figure 4:
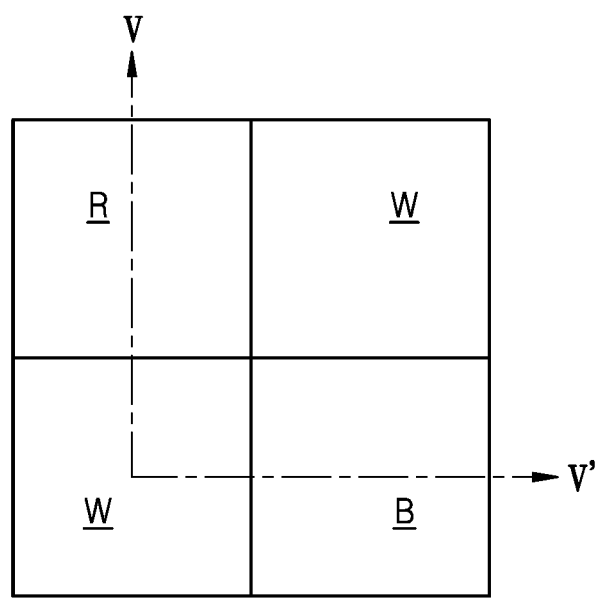
FIG. 4 is a plan view of a unit pixel of a stacked image sensor according to another exemplary embodiment.
Figure 5:
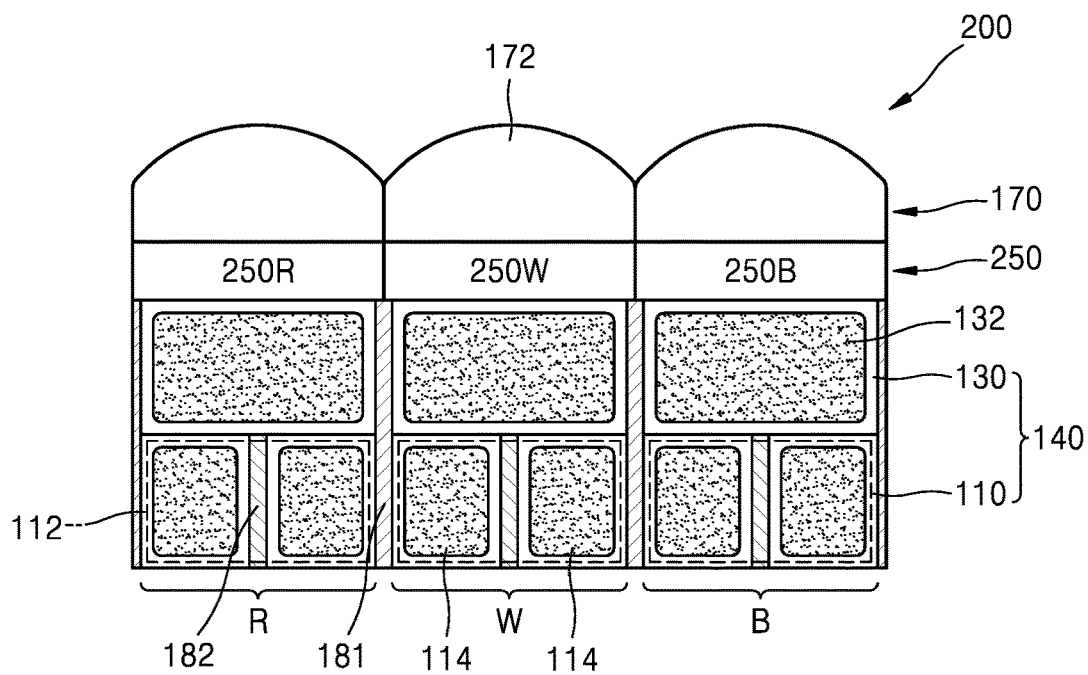
FIG. 5 is a cross-sectional view taken along a line V-V' of FIG. 4.

FIG. 4 is a plan view of a unit pixel of a stacked image sensor 200 according to another exemplary embodiment. FIG. 5 is a cross-sectional view taken along a line V-V' of FIG. 4. Like reference numerals are used for elements that are substantially identical to the constituent elements described above, and the descriptions thereof will not be repeated.

Referring to FIG. 4, the stacked image sensor 200 includes a plurality of pixel units PU' arranged in an array. Each pixel unit PU' may include two white pixels W, a red pixel R, and a blue pixel B.

Referring to FIG. 5, a color filter layer 250 includes a plurality of color filters 250R, 250W, and 250B. In the red pixel R, the red color filter 250R is disposed on the second photoelectric conversion region 132 and transmits red light. In the white pixel W, the white color filter 250W is disposed on the second photoelectric conversion region 132 and transmits white light. That is, the white color filter 250W transmits all of red light, green light, and blue light. In the blue pixel B, the blue color filter 250B is disposed on the second photoelectric conversion region 132 and transmits blue light.

The white color filter 250W may be formed of a material having no pigments and no dyes that have color components of red, green, and blue color filters.

The stacked image sensor 200 that employs the white color filter 250W may have an increased sensitivity, and accordingly, size of pixels may be reduced.

However, the exemplary embodiment is not limited thereto. For example, a structure of the stacked image sensor 200 without having the white color filter 250W is also possible. In FIG. 5, the region of the white color filter 250W may be filled with a micro-lens 172.

Figure 6:
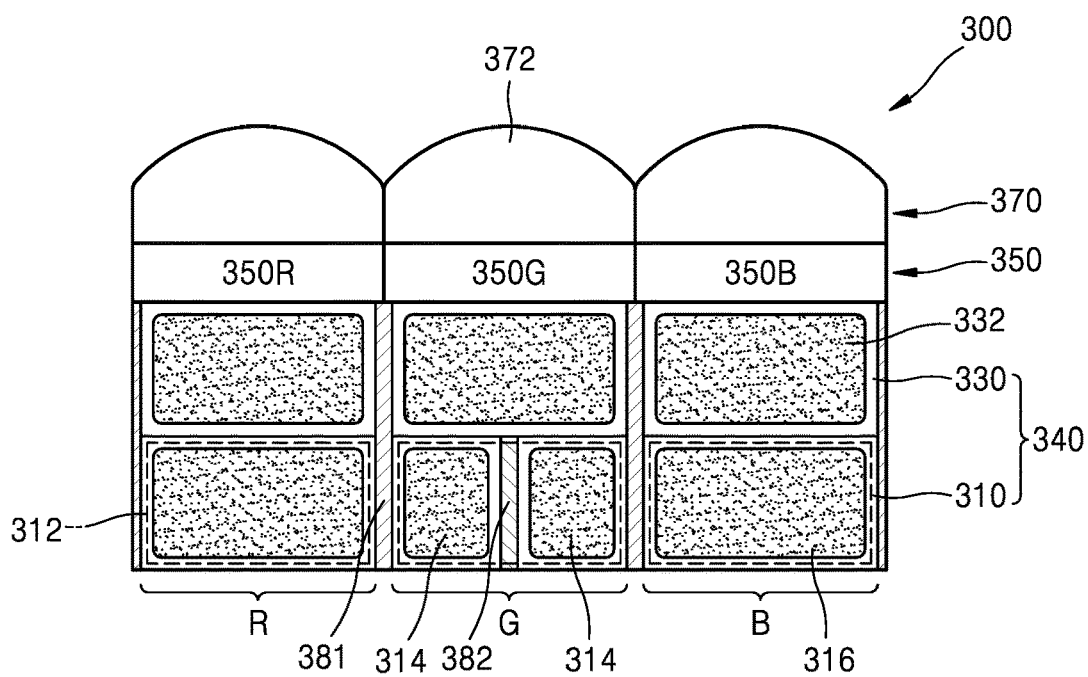
FIG. 6 is a schematic cross-sectional view of a structure of a unit pixel of a stacked image sensor according to another exemplary embodiment.

FIG. 6 is a schematic cross-sectional view showing a structure of a unit pixel of a stacked image sensor 300 according to another exemplary embodiment. FIG. 6 may be a cross-sectional view taken along a line II-II' of FIG. 1. Like reference numerals are used for elements that are substantially identical to the constituent elements described above, and the descriptions thereof will not be repeated.

Referring to FIG. 6, the stacked image sensor 300 includes a plurality of pixel units arranged in an array. Each pixel unit may include two green pixels G, a red pixel R, and a blue pixel B.

The pixel unit includes a first photoelectric conversion layer 310 and includes a second photoelectric conversion layer 330, a color filter layer 350, and a micro-lens layer 370 are sequentially disposed on the first photoelectric conversion layer 310.

The first photoelectric conversion layer 310 and the second photoelectric conversion layer 330 may be regions disposed in a silicon layer 340. The first photoelectric conversion layer 310 may include a first photoelectric conversion region 312 in each pixel. In the pixel unit, the first photoelectric conversion region 312 in some pixel regions may include two third photoelectric conversion regions 314. For example, one fourth photoelectric conversion region 316 is disposed in each region of the red pixel R and the blue pixel G, and two third photoelectric conversion regions 314 may be disposed in the green pixel G. The second photoelectric conversion layer 330 may include a second photoelectric conversion region 332 in each pixel region. The third photoelectric conversion regions 314, the fourth photoelectric conversion regions 316, and the second photoelectric conversion region 332 may be doped regions. For example, the silicon layer 340 may be a region doped with a first type impurity and the third photoelectric conversion regions 314, the fourth photoelectric conversion regions 316, and the second photoelectric conversion region 332 may be regions doped with a second type impurity. When the first type impurity is an n-type impurity, the second type impurity may be a p-type impurity, and vice versa.

The second photoelectric conversion region 332 may be a general image detection region. The two third photoelectric conversion regions 314 in the green pixel region G may perform auto-focusing by detecting light transmitted through the green color filter 350G and the second photoelectric conversion region 332 thereon.

The fourth photoelectric conversion region 316 may be used as an image detection region.

The color filter layer 350 includes a plurality of color filters 350R, 350G, and 350B. In the red pixel R, the red color filter 350R is disposed on the second photoelectric conversion region 332, and thus, red light is selectively transmitted therethrough. In the green pixel G, the green color filter 350G is disposed on the second photoelectric conversion region 332, and thus, green light is selectively transmitted therethrough. In the blue pixel B, the blue color filter 350B is disposed on the second photoelectric conversion region 332, and thus, blue light is selectively transmitted therethrough.

The micro-lens layer 370 includes a plurality of micro-lenses 372. The micro-lenses 372 are respectively disposed on each of the color filters 350R, 350G, and 350B to focus incident light and to send it to corresponding color filters 350R, 350G, and 350B.

The stacked image sensor 300 may include first barriers 381 that divide the pixels R, G, and B from each other. The first barriers 381 passes through the first photoelectric conversion layer 310 and the second photoelectric conversion layer 330. The first barriers 381 may have the same structure as the first barriers 181 of FIG. 3, and the description thereof will be omitted.

In the first photoelectric conversion layer 310, a second barrier 382 that separates the two third photoelectric conversion regions 314 may be disposed in the region of green pixel G. The second barrier 382 may have the same structures as the first barrier 381, and the detailed description thereof will be omitted.

The first barriers 381 and the second barrier 382 prevent incident light entering corresponding pixels from entering pixels of other adjacent regions that causes a noise.

The stacked image sensor 300 according to the exemplary embodiment may further include a signal processor that outputs an electrical signal in response to charges received from the photoelectric conversion regions. The signal processor may include three to four transistors per pixel. The signal processor may be disposed under the first photoelectric conversion layer 310.

When visible light enters the stacked image sensor 300 from an image measuring object, red light of visible light passes through the red color filter 350R and generates charges in the second photoelectric conversion region 332. The signal processor outputs an intensity signal of the red light based on the generated charges. Green light and blue light of the visible light enter the corresponding second photoelectric conversion regions 132 respectively through the green color filter 350G and the blue color filter 350B and generate charges, and intensity signals of the green light and the blue light are output by the signal processor based on the generated charges.

Light that passes through the second photoelectric conversion region 332 of the green pixel G is detected by the two third photoelectric conversion regions 314. Phase detection auto-focusing may be performed using images of the two third photoelectric conversion regions 314. An image is photographed by fixing a focus lens at the auto-focusing location.

After performing the phase detection auto-focusing, a location of a focusing lens may be determined by performing contrast detection auto-focusing with respect to contrast differences of images from the second photoelectric conversion region 332.

When an image is photographed under high illumination conditions, an amount of light entering the focusing lens is increased. Accordingly, image photographing may be difficult since the light that entered the second photoelectric conversion region 332 is saturated. In this case, a relatively small amount of light enters into third photoelectric conversion regions 314, and thus, the fourth photoelectric conversion regions 316 may be used for image photographing.

The stacked image sensor 300 according to the exemplary embodiment uses only the green pixel region for auto-focusing. Therefore, a structure of wiring connected to the fourth photoelectric conversion regions 316 in the red pixel region and the blue pixel region may be reduced when compared with the stacked image sensor 100.

In the stacked image sensor 300 according to the exemplary embodiment, the photoelectric conversion region for auto-focusing is formed in the green pixel region, but the exemplary embodiment is not limited thereto. For example, the two third photoelectric conversion regions may be formed in one region or two regions selected from the four pixel regions of the pixel unit instead of two green pixel regions.

Also, the fourth photoelectric conversion regions may not be formed in the first photoelectric conversion layer where there is no photoelectric conversion region for auto-focusing. In this case, the wiring structure may further be simplified.

Figure 7:
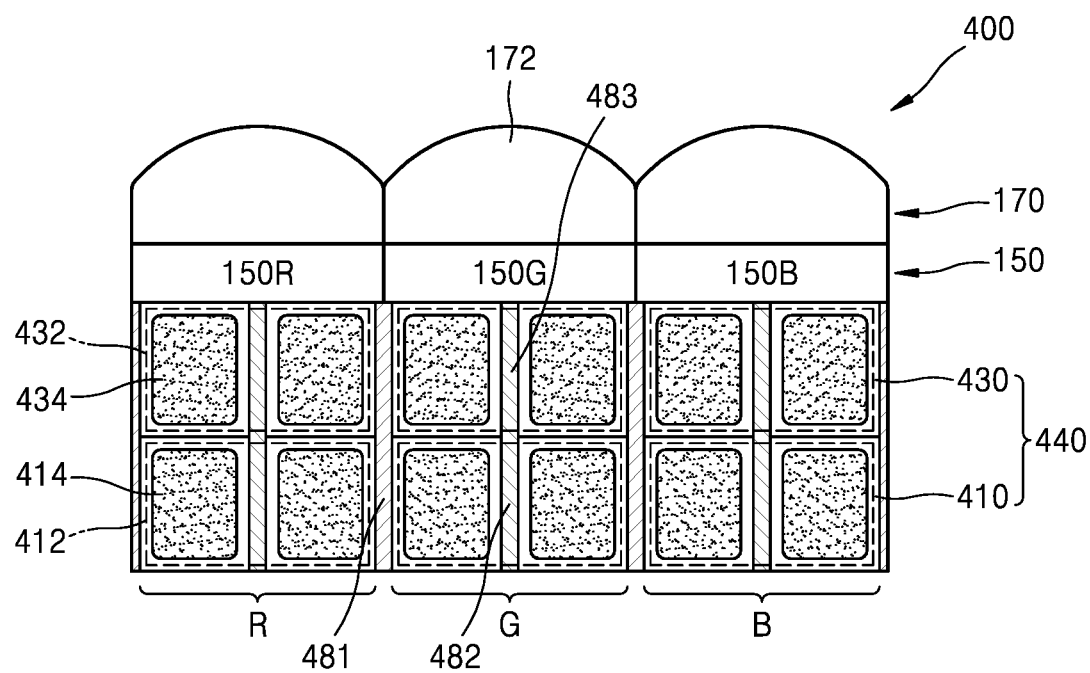
FIG. 7 is a cross-sectional view of a structure of a unit pixel of a stacked image sensor according to another exemplary embodiment.

FIG. 7 is a schematic cross-sectional view of a structure of a unit pixel of a stacked image sensor 400 according to another exemplary embodiment. FIG. 7 may be a cross-sectional view taken along a line II-II' of FIG. 1. Like reference numerals are used for elements that are substantially identical to the constituent elements described above, and the descriptions thereof will not be repeated.

Referring to FIG. 7, the stacked image sensor 400 may include a plurality of pixel units arranged in an array. Each pixel unit may include two green pixels G, a red pixel R, and a blue pixel B.

Each pixel unit may include a first photoelectric conversion layer 410, and a second photoelectric conversion layer 430, a color filter layer 150, and a micro-lens layer 170 that are sequentially stacked on the first photoelectric conversion layer 410.

The first photoelectric conversion layer 410 and the second photoelectric conversion layer 430 may be regions disposed on a silicon layer 440. The first photoelectric conversion layer 410 may include first photoelectric conversion regions 412 disposed in each pixel. The first photoelectric conversion region 412 may include a plurality of third photoelectric conversion regions 414. In FIG. 7, two third photoelectric conversion regions 414 are depicted in a pixel region.

The second photoelectric conversion layer 430 may include a plurality of second photoelectric conversion regions 432. Each second photoelectric conversion region 432 may include a plurality of fourth photoelectric conversion regions 434. In FIG. 7, two fourth photoelectric conversion regions 434 are depicted in a pixel region. The two third photoelectric conversion regions 414 and the two fourth photoelectric conversion regions 434 in the pixel may be doped regions. For example, the silicon layer 440 may be a region doped with a first type impurity, and the third photoelectric conversion regions 414 and the fourth photoelectric conversion regions 434 may be regions doped with a second impurity.

The fourth photoelectric conversion regions 434 may be general image detection regions. The fourth photoelectric conversion regions 434 may perform an auto-focusing in a low illumination atmosphere.

The first photoelectric conversion regions 412 perform auto-focusing by detecting light that passed through a color filter thereabove. The first photoelectric conversion regions 412 may be used for image detecting regions under high illumination conditions.

The color filter layer 150 may include a plurality of color filters 150R, 150G, and 150B. The micro-lens layer 170 may include a plurality of micro-lenses 172.

The stacked image sensor 400 according to the exemplary embodiment may include first barriers 481 that divide the pixels. The first barriers 481 pass through the second photoelectric conversion layer 430 and the first photoelectric conversion layer 410. The first barriers 481 may have the same structure as the first barriers 181 in FIG. 3, and thus, the detailed descriptions thereof will not be repeated.

A second barrier 482 that separates the two third photoelectric conversion regions 414 from each other may be disposed in the first photoelectric conversion layer 410 of each pixel. The second barrier 482 may have the same structure as the first barriers 481, and thus, the detailed descriptions thereof will not be repeated.

A third barrier 482 that separates the two fourth photoelectric conversion regions 434 from each other may be disposed in the second photoelectric conversion layer 430 of each pixel. The third barrier 483 may have a structure connected to the second barrier 482 or a structure not connected to the second barrier 482. The third barrier 483 may have the same structure as the first and second barriers 481 and 482, and thus, the detailed descriptions thereof will not be repeated.

The first through third barriers 481, 482, and 483 prevent light incident onto a corresponding photoelectric conversion region from entering other adjacent photoelectric conversion regions.

The stacked image sensor 400 according to the exemplary embodiment may further include a signal processor that outputs an electrical signal in response to charges received from each of the photoelectric conversion regions. The signal processor may include three to four transistors per pixel. The signal processor may be disposed under the first photoelectric conversion layer 410.

Under high illumination conditions, auto-focusing may be performed via the first photoelectric conversion regions into which light that passed through the second photoelectric conversion region enters. Under low illumination conditions, auto-focusing may be performed via the second photoelectric conversion region into which light that passed through the color filter enters.

The stacked image sensor according to the exemplary embodiment includes an additional auto-focusing photoelectric conversion region under an image measuring pixel. Therefore, all pixel regions are used for image photographing while performing auto-focusing, and accordingly, a high resolution image may be photographed.

Under high illumination conditions, image photographing may be performed via an auto-focusing photoelectric conversion region into which relatively small amount of light enters, and thus, a high resolution image may be obtained even under high illumination conditions.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A stacked image sensor comprising:
   a first photoelectric conversion layer including a plurality of first photoelectric conversion units corresponding to a plurality of pixel regions;
   a second photoelectric conversion layer disposed on the first photoelectric conversion layer, and including a plurality of second photoelectric conversion units corresponding to the plurality of pixel regions;
   a plurality of color filters disposed on the plurality of second photoelectric conversion units corresponding to the plurality of pixel regions; and
   a plurality of first barriers that separate the plurality of pixel regions from one another and vertically pass through the second photoelectric conversion layer and the first photoelectric conversion layer,
   wherein at least one of the plurality of first photoelectric conversion units includes a plurality of third photoelectric conversion units that perform auto-focusing,
   wherein each of the first barriers comprises:
   a trench that divides the plurality of pixel regions;
   an insulating layer disposed on an inner sidewall of the trench to make a hole therein; and
   a light absorption layer filled in the hole.

2. The stacked image sensor of claim 1, wherein each of the plurality of first photoelectric conversion units includes the plurality of third photoelectric conversion units.

3. The stacked image sensor of claim 2, wherein each of the plurality of first photoelectric conversion units includes two third photoelectric conversion units.

4. The stacked image sensor of claim 2, wherein at least one of the plurality of second photoelectric conversion units respectively include a plurality of fourth photoelectric conversion units.

5. The stacked image sensor of claim 4, wherein the plurality of fourth photoelectric conversion units include two fourth photoelectric conversion units.

6. The stacked image sensor of claim 1, further comprising a plurality of second barriers, each of the plurality of second barriers being configured to separate the plurality of third photoelectric conversion units in the corresponding pixel region and vertically passing through the first photoelectric conversion layer.

7. The stacked image sensor of claim 6, wherein each of the plurality of second barriers comprises:
   a trench that separates the plurality of third photoelectric conversion units in the corresponding pixel region;
   an insulating layer that covers an inner sidewall of the trench to make a hole therein; and
   a light absorption layer filled in the hole.

8. The stacked image sensor of claim 1, wherein the plurality of color filters includes a plurality of color filter units arranged in an array, and each of the plurality of color filter units includes a red color filter, two green color filters, and a blue color filter.

9. The stacked image sensor of claim 1, wherein the plurality of color filters includes a plurality of color filter units arranged in an array, and each of the plurality of color filter units includes a red color filter, two white color filters, and a blue color filter.

10. The stacked image sensor of claim 1, wherein the first photoelectric conversion layer and the second photoelectric conversion layer are a silicon layer doped with a first impurity, and the plurality of first photoelectric conversion units and the plurality of second photoelectric conversion unit are doped with a second type impurity.

11. The stacked image sensor of claim 1, further comprising a plurality of micro-lenses disposed on the plurality of color filters to face the first photoelectric conversion layer.

* * * * *